US009531407B2

(12) United States Patent
Lee et al.

(10) Patent No.: US 9,531,407 B2
(45) Date of Patent: Dec. 27, 2016

(54) METHOD AND INTERLEAVING APPARATUS FOR INTERLEAVING FOR ERROR DISPERSION AND COMPUTER READABLE RECORDING MEDIUM FOR PERFORMING THE SAME

(71) Applicant: Foundation of Soongsil University-Industry Cooperation, Seoul (KR)

(72) Inventors: Jaejin Lee, Seoul (KR); Junghyun Park, Namyangju-si (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 174 days.

(21) Appl. No.: 14/583,025

(22) Filed: Dec. 24, 2014

(65) Prior Publication Data

US 2016/0105201 A1   Apr. 14, 2016

(30) Foreign Application Priority Data

Oct. 14, 2014   (KR) .......................... 10-2014-0138551

(51) Int. Cl.
*H03M 13/27*   (2006.01)

(52) U.S. Cl.
CPC ..... *H03M 13/2778* (2013.01); *H03M 13/2703* (2013.01); *H03M 13/2792* (2013.01)

(58) Field of Classification Search
CPC ............ G11C 11/40618; G11C 7/1042; H03M 13/2714; H03M 13/276; H03M 13/2789; H03M 13/2792; H03M 13/2703; H03M 13/271; H03M 13/2742; H03M 13/2771; H03M 13/2707; H03M 13/2717; H03M 13/2767; H03M 13/2778; G06F 12/0607; G06F 15/8023; G06F 13/164

See application file for complete search history.

(56) References Cited

U.S. PATENT DOCUMENTS 5,566,183 A * 10/1996 Partyka ............. H03M 13/2764
                                                        375/340
5,642,365 A *  6/1997 Murakami ............ H03M 13/05
                                                        714/758

(Continued)

FOREIGN PATENT DOCUMENTS

FR   WO 9516311 A1 *  6/1995   ........ H03M 13/2707
JP   WO 2015083247 A1 *  6/2015   ....... G11B 20/10268

(Continued)

*Primary Examiner* — Cynthia Britt
(74) *Attorney, Agent, or Firm* — Novick, Kim & Lee, PLLC; Sang Ho Lee

(57) ABSTRACT

An interleaving apparatus, a computer-readable recording medium, and a method for interleaving data elements comprised in data frame which are transmitted via a channel for error dispersion are provided. The interleaving apparatus includes a block division unit that divides a given page of the data frame including two-dimensional array data into a plurality of data block units, and an interleaving unit that performs interleaving at least between two of the plurality of data blocks units, which are divided by the block division unit. A first block unit in the plurality of data block units is set as a reference interleaving block unit, and first data in the first block unit and second data in a second block unit are interleaved. The first block unit and the second block unit are included in the plurality of data block units, and the first block unit is different from the second block unit.

6 Claims, 15 Drawing Sheets

(56) References Cited

U.S. PATENT DOCUMENTS

| | | | | |
|---|---|---|---|---|
| 6,323,788 | B1* | 11/2001 | Kim | H03M 13/23 341/81 |
| 6,356,992 | B1* | 3/2002 | Baxter | G06F 15/17337 370/406 |
| 6,392,572 | B1* | 5/2002 | Shiu | H03M 13/2771 341/81 |
| 6,848,036 | B1* | 1/2005 | Dave | H03M 13/2703 711/157 |
| 6,948,048 | B2* | 9/2005 | Baxter | G06F 15/17337 370/406 |
| 7,187,613 | B2* | 3/2007 | Yang | G11C 29/82 365/185.03 |
| 8,817,626 | B2* | 8/2014 | Auranen | H04L 27/2647 370/229 |
| 2003/0091098 | A1* | 5/2003 | Manninen | H03M 13/2703 375/133 |
| 2003/0207696 | A1* | 11/2003 | Willenegger | H04W 52/40 455/522 |
| 2007/0263438 | A1* | 11/2007 | Chen | G11C 16/26 365/185.03 |
| 2008/0316835 | A1* | 12/2008 | Chen | G06F 12/0207 365/189.05 |
| 2009/0092118 | A1* | 4/2009 | Naka | H04L 1/0071 370/343 |
| 2009/0251531 | A1* | 10/2009 | Marshall | H04N 13/0438 348/42 |
| 2010/0316153 | A1* | 12/2010 | Wang | H04L 1/0071 375/260 |
| 2011/0099452 | A1* | 4/2011 | Rumbolt | H03M 13/2909 714/755 |
| 2011/0310829 | A1* | 12/2011 | Ji | H04L 5/0037 370/329 |
| 2013/0088972 | A1* | 4/2013 | Kim | H04L 5/001 370/241 |
| 2013/0136164 | A1* | 5/2013 | Ronc | H04L 1/0054 375/224 |
| 2014/0195702 | A1* | 7/2014 | Seo | H03M 7/3084 710/53 |
| 2015/0358034 | A1* | 12/2015 | Baek | H04L 5/0044 714/776 |
| 2016/0197703 | A1* | 7/2016 | Park | H04L 1/0064 714/755 |

FOREIGN PATENT DOCUMENTS

| | | |
|---|---|---|
| KR | 10-0330980 B1 | 4/2002 |
| KR | 2002-0028639 A | 4/2002 |
| KR | 10-0354744 B1 | 12/2002 |
| KR | 10-0416057 B1 | 1/2004 |
| KR | 10-2007-0093447 A | 9/2007 |
| KR | 10-2008-0041488 A | 5/2008 |

\* cited by examiner

1024×1024 pages with 40×40 burst error
BER performances of various interleavers

1024x1024 pages with 60x60 burst error
BER performances of various interleavers

256x256 pages with 30x30 burst error
BER performances of various interleavers

METHOD AND INTERLEAVING APPARATUS FOR INTERLEAVING FOR ERROR DISPERSION AND COMPUTER READABLE RECORDING MEDIUM FOR PERFORMING THE SAME

CROSS-REFERENCE TO RELATED APPLICATION

This application claims priority to and the benefit of Korean Patent Application No. 10-2014-0138551, filed on Oct. 14, 2014, the disclosure of which is incorporated herein by reference in its entirety.

BACKGROUND

The present disclosure relates to an interleaving method and apparatus for error dispersion, and more particularly, to an interleaving method and apparatus for dispersion of burst errors.

In existing, a variety of interleaving methods have been used for dispersion of errors. For example, for the purpose of dispersion of burst errors in two-dimensions, a block interleaver, a cyclic shift interleaver, a helical interleaver, a random interleaver, and the like have been used.

The block interleaver may change data positioned in the horizontal direction among data arrayed in the two-dimensions into data positioned in the vertical direction to align the changed data, and then output data in the horizontal direction. This method may be effective in the case of inputting data in a line and outputting data in a line, but has a less dispersive effect on burst errors through interleaving in the case of writing and reading data in the two-dimensions.

The cyclic shift interleaver may perform interleaving with respect to data arrayed in the two-dimensions by performing a shift with respect to data positioned in each row among the data arrayed in the two-dimensions.

The helical interleaver reads up to data diagonally positioned in a final row and a final column starting from data positioned in a first row and a first column among the data arrayed in the two-dimensions. Next, the helical interleaver reads up to data diagonally positioned in a final row and a final column starting from data positioned in a second row and a first column. Next, the helical interleaver reads up to data diagonally positioned in a final row and a final column starting from data positioned in a third row and a first column. When reaching the final row while continuing to read data in the above-described manner, the above-described process may proceed until all unread data is read by going back to a row in which there is the unread data. The helical interleaver may sequentially array the read data in each row in the two-dimensions.

The random interleaver may generate a random number, and perform interleaving by exchanging an index and data corresponding to the generated random number.

SUMMARY

The present disclosure is directed to an interleaving method for error dispersion.

The present disclosure is also directed to an interleaving apparatus for error dispersion.

According to an aspect of the present disclosure, there is provided an interleaving method for error dispersion including: dividing a page including two-dimensional (2D) array data into a plurality of data block units; and performing interleaving between each of the plurality of data blocks, wherein one block among the plurality of data blocks is set as a reference interleaving block, and the interleaving is performed between data included in the reference interleaving block and data included in the remaining blocks excluding the reference interleaving block among the plurality of data blocks.

Here, a size of the 2D array data may be $N^2 \times M^2$ (where, each of M and N is an integer of 2 or greater), and a size of each of the plurality of data block units may be $N \times M$.

Also, the interleaving may be performed based on the following Equation.

$$X_i(S_j) \leftrightarrow X_j(S_i), i,j=0,1,2,\ldots,N\times M-1, \quad \text{[Equation]}$$

where $X_i^{th}(S_j)$ denotes j-th data included in an i-th data block unit, and $X_j^{th}(S_i)$ denotes i-th data included in a j-th data block unit.

Also, a size of the 2D array data may be $(2^{2n}+a) \times (2^{2n}+b)$ where each of n, a, and b is an integer of 1 or greater, a size of each of the plurality of data block units may be $2^n \times 2^n$, and the interleaving may be performed based on the following Equation.

$$M_i(S_j) \leftrightarrow M_j(S_i), i,j=0,1,2,\ldots,2^n \times 2^n-1, \quad \text{[Equation]}$$

where $M_i(S_j)$ denotes j-th data included in an i-th data block unit, and $M_j(S_i)$ denotes i-th data included in a j-th data block unit.

Also, the interleaving method may further include: performing peripheral interleaving with respect to the remaining data excluding data included in the plurality of data block units among the 2D array data in accordance with whether each of a and b is a certain value or greater.

Also, the remaining data may be classified into first peripheral data, second peripheral data, third peripheral data, and fourth peripheral data in accordance with a position of the remaining data on the 2D array data, and the peripheral interleaving may be performed based on first peripheral interleaving based on a first cyclic shift size with respect to each of the first peripheral data, second peripheral interleaving based on a second cyclic shift size with respect to each of the second peripheral data, third peripheral interleaving based on a third cyclic shift size with respect to each of the third peripheral data, and fourth peripheral interleaving based on a fourth cyclic shift size with respect to each of the fourth peripheral data.

According to another aspect of the present disclosure, there is provided a computer-readable recording medium in which a computer program is recorded in order to perform interleaving.

According to still another aspect of the present disclosure, there is provided an interleaving apparatus including: a block division unit that divides a page including 2D array data into a plurality of data block units; and an interleaving unit that performs interleaving between each of the plurality of data blocks divided by the block division unit, wherein one block among the plurality of data blocks is set as a reference interleaving block, and the interleaving is performed between data included in the reference interleaving block and data included in remaining blocks excluding the reference interleaving block among the plurality of data blocks.

Here, a size of the 2D array data may be $N^2 \times M^2$ where, each of M and N being an integer of 2 or greater, and a size of each of the plurality of data block units may be $N \times M$.

Also, the interleaving may be performed based on the following Equation.

$$X_i(S_j) \leftrightarrow X_j(S_i), i,j=0,1,2,\ldots,N\times M-1, \quad \text{[Equation]}$$

where $X_i^{th}(S_j)$ denotes j-th data included in an i-th data block unit, and $X_j^{th}(S_i)$ denotes i-th data included in a j-th data block unit.

Also, a size of the 2D array data may be $(2^{2n}+a) \times (2^{2n}+b)$ where each of n, a, and b is an integer of 1 or greater), a size of each of the plurality of data block units may be $2^n \times 2^n$, and the interleaving may be performed based on the following Equation.

$$M_i(S_j) \leftrightarrow M_j(S_i), i,j=0,1,2, \ldots 2^n \times 2^n - 1, \quad \text{[Equation]}$$

where $M_i(S_j)$ denotes j-th data included in an i-th data block unit, and $M_j(S_i)$ denotes i-th data included in a j-th data block unit.

Also, the interleaving apparatus may further include: a peripheral interleaving unit that performs peripheral interleaving with respect to remaining data excluding data included in the plurality of data block units among the 2D array data in accordance with whether each of a and b is a certain value or greater, wherein the remaining data is classified into first peripheral data, second peripheral data, third peripheral data, and fourth peripheral data in accordance with a position of the remaining data on the 2D array data, and the peripheral interleaving is performed based on first peripheral interleaving based on a first cyclic shift size with respect to each of the first peripheral data, second peripheral interleaving based on a second cyclic shift size with respect to each of the second peripheral data, third peripheral interleaving based on a third cyclic shift size with respect to each of the third peripheral data, and fourth peripheral interleaving based on a fourth cyclic shift size with respect to each of the fourth peripheral data.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
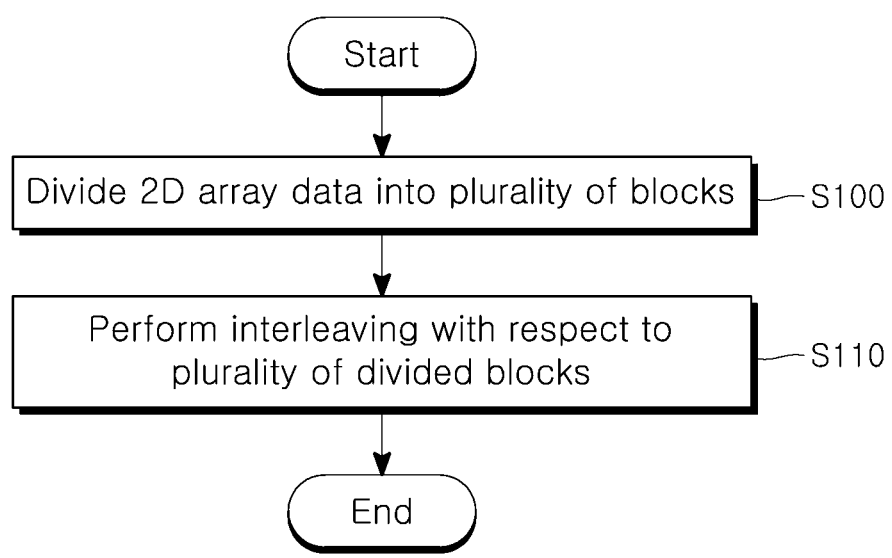
FIG. 1 is a conceptual diagram illustrating an interleaving method according to an embodiment of the present disclosure.

Exemplary embodiments of the present disclosure will be described in detail below with reference to the accompanying drawings. While the present disclosure is shown and described in connection with exemplary embodiments thereof, it will be apparent to those skilled in the art that various modifications can be made without departing from the spirit and scope of the disclosure.

Example embodiments of the present disclosure are disclosed herein. However, specific structural and functional details disclosed herein are merely representative for purposes of describing example embodiments of the present disclosure, and example embodiments of the present disclosure may be embodied in many alternate forms and should not be construed as being limited to example embodiments of the present disclosure set forth herein.

Accordingly, while the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure. Like numbers refer to like elements throughout the description of the figures.

Hereinafter, embodiments of the present disclosure will be described in detail with reference to the accompanying drawings.

A holographic data storage (HDS) system is a system that volumetrically stores data in a holographic medium unlike an existing system. The existing system uses a method of reading and writing data on a surface of the medium, but the HDS system uses a method of reading and writing data in units of pages. Thus, the HDS system has a faster access speed than that of an existing storage device. The HDS system is receiving attention as a high-capacity, high-speed, and next-generation storage device.

However, in the HDS system, due to inter-symbol interference (ISI) between adjacent information, scattering caused by defects in an optical system, fixed pattern noise (FPN) in a spatial light modulator (SLM), charge-coupled device (CCD), and the like, a two-dimensional (2D) congestion error (or a 2D burst error) may occur when data is read. Such a burst error may occur at any position of a page in which data is stored in the HDS system. When the burst error occurs in the page in which data is stored, correction may be impossible with an error correction code. This is because errors are concentrated in a specific portion and thereby data may be continuously lost at a time. Thus, a variety of 2D interleaving methods for preventing errors from being concentrated in a specific portion in such a burst error condition have been proposed.

Interleaving refers to a technique that converts, into a random bit error, a burst error that occurs when any encoded information is appropriately dispersed and passes through a channel, and enables a channel decoder to process the corresponding error. When using interleaving, communication performance may be improved in the burst error condition. Because of such an advantage, an interleaving process and a de-interleaving process may be used in various communication systems.

Among existing interleavers, a block interleaver, a cyclic shift interleaver, a helical interleaver, and a random interleaver may have a more excellent performance in the 2D burst error condition in the stated order. However, the existing interleavers have been developed considering a system of inputting and outputting data in a line, and cannot evenly disperse 2D burst errors existing in a specific page, throughout the page.

Hereinafter, according to an embodiment of the present disclosure, an interleaving method that performs interleaving in order to have a lower bit error than those of existing interleavers so that a 2D burst error is changed into a random error, and interleaver are disclosed.

FIG. 1 is a flowchart illustrating an interleaving method according to an embodiment of the present disclosure.

Referring to FIG. 1, in operation S100, the interleaving method may divide 2D array data into a plurality of blocks for the purpose of interleaving.

The interleaving method according to an embodiment of the present disclosure may be used when a size of a page is $2^{2n} \times 2^{2n}$. The page having the size of $2^{2n} \times 2^{2n}$ may be divided into $2^n \times 2^n$ blocks having a size of $2^n \times 2^n$. That is, the page including the 2D array data may be divided into a plurality of blocks (or data blocks) including 2D array data in sub-units.

Each of the $2^n \times 2^n$ blocks having the size of $2^n \times 2^n$ divided from a single page may be represented as a symbol $M_i$. In this instance, i denotes a block index for indicating a block, and i=0, 1, 2, ..., $2^n \times 2^n - 1$. Each block may have $2^n \times 2^n$ pixels. The $2^n \times 2^n$ pixels included in each block may be referred to as $S_j$. In this instance, j denotes a pixel index for indicating pixels included in a block, and j=0, 1, 2, ..., $2^n \times 2^n - 1$.

In operation S110, the interleaving method may perform interleaving with respect to the plurality of divided blocks.

The interleaving method according to an embodiment of the present disclosure may exchange a pixel $S_j^{th}$ in a block $M_i^{th}$ and a pixel $S_i^{th}$ in a block $M_j^{th}$. Such an interleaving method may be represented as the following Equation 1.

$$M_i(S_j) \leftrightarrow M_j(S_i), i,j=0,1,2,\ldots,2^n \times 2^n - 1 \quad [\text{Equation 1}]$$

According to another embodiment of the present disclosure, the interleaving method may be used when a size of a page is $N^2 \times M^2$. Here, each of N and M may be an integer of 2 or greater. FIG. 1 may correspond to a case in which N and M are the same and $N=2^n, M=2^n$. Interleaving with respect to a general page size may be performed as follows.

A page having a size of $N^2 \times M^2$ may be divided into $N \times M$ blocks each having a size of $N \times M$. That is, the page including the 2D array data may be divided into a plurality of blocks (or data blocks) including the 2D array data in sub-units. Each of the four blocks having a size of $N \times M$ divided from a single page may be represented as a symbol $M_i$. In this instance, i denotes a block index for indicating a block, and i=0, 1, 2, ..., $N \times M - 1$. Each block may include $N \times M$ pixels. The $N \times M$ pixels included in each block may be referred to as $S_j$. In this instance, j denotes a pixel index for indicating pixels included in a block, and j=0, 1, 2, ..., $N \times M - 1$.

In operation in S110, the interleaving method according to an embodiment of the present disclosure may perform interleaving with respect to the plurality of blocks.

The interleaving method according to an embodiment of the present disclosure may exchange a pixel $S_j^{th}$ in a block $X_i^{th}$ and a pixel $S_i^{th}$ in a block $X_j^{th}$. Such an interleaving method may be represented as the following Equation 2.

$$X_i(S_j) \leftrightarrow X_j(S_i), i,j=0,1,2,\ldots,N \times M - 1 \quad [\text{Equation 2}]$$

Figure 2:
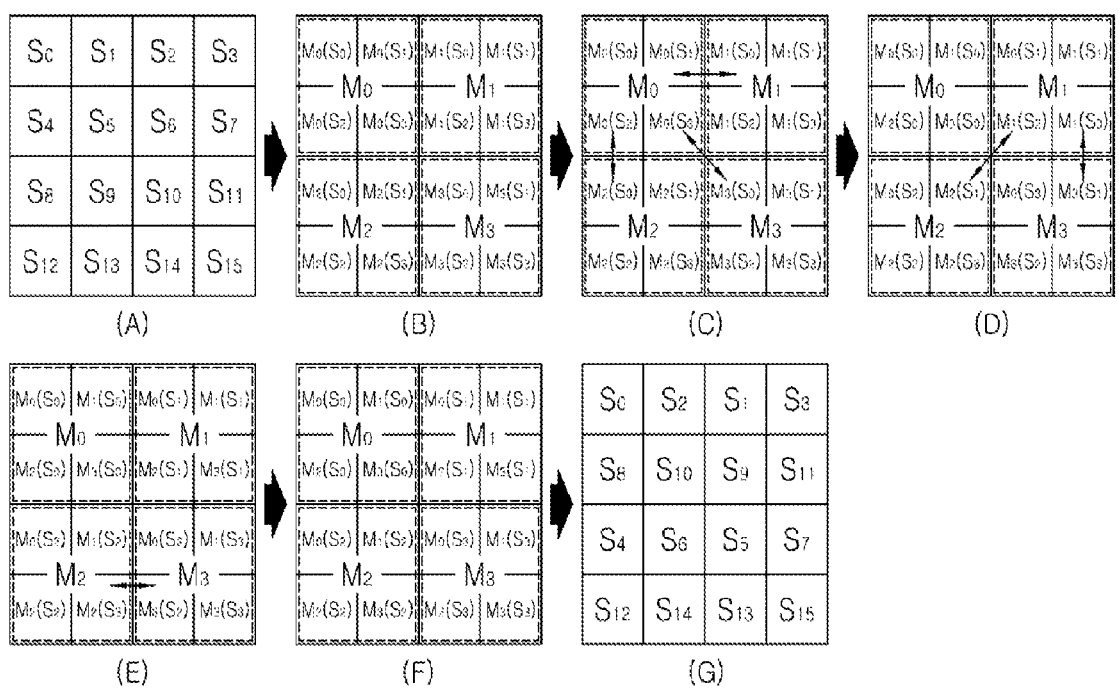
FIG. 2 is a conceptual diagram illustrating an interleaving method according to an embodiment of the present disclosure.

FIG. 2 is a conceptual diagram illustrating an interleaving method according to an embodiment of the present disclosure.

In FIG. 2, an interleaving method in a case in which a size of a page is 4×4 is disclosed.

Referring to (A) of FIG. 2, the page having the size of 4×4 may include 16 pixels $S_0$ to $S_{15}$.

Referring to (B) of FIG. 2, the page having the size of 4×4 may be divided into blocks having a size of 2×2. Each block may be indicated as $M_0$ to $M_3$. Each block may include four pixels $M_0(S_0)$ to $M_0(S_3)$, $M_1(S_0)$ to $M_1(S_3)$, $M_2(S_0)$ to $M_2(S_3)$, and $M_3(S_0)$ to $M_3(S_3)$.

Referring to (C) to (F) of FIG. 2, interleaving may be preferentially performed with respect to a block having a small block index. That is, interleaving may be performed in the order of $M_0$ to $M_3$. Interleaving performed in each block may be represented as the following Table 1.

TABLE 1

| Interleaving reference block | Interleaving pixel for each block |
|---|---|
| $M_0$ | $M_0(S_1) \leftrightarrow M_1(S_0)$ |
|  | $M_0(S_2) \leftrightarrow M_2(S_0)$ |
|  | $M_0(S_3) \leftrightarrow M_3(S_0)$ |
| $M_1$ | $M_1(S_2) \leftrightarrow M_2(S_1)$ |
|  | $M_1(S_3) \leftrightarrow M_3(S_1)$ |
| $M_2$ | $M_2(S_3) \leftrightarrow M_3(S_2)$ |
| $M_3$ |  |

That is, interleaving may be sequentially performed on pixels included in a block included in a corresponding page.

Referring to Table 1, interleaving may be performed with respect to a pixel having a larger pixel index than a block index in the order of blocks having a smaller block index. That is, a block $M_0$ of a block index 0 may perform interleaving with respect to $S_1, S_2, S_3$, a block $M_1$ of a block index 1 may perform interleaving with respect to $S_2, S_3$, and a block $M_2$ of a block index 2 may perform interleaving with respect to $S_3$.

In (G) of FIG. 2, results obtained by performing interleaving are illustrated.

Figure 3:
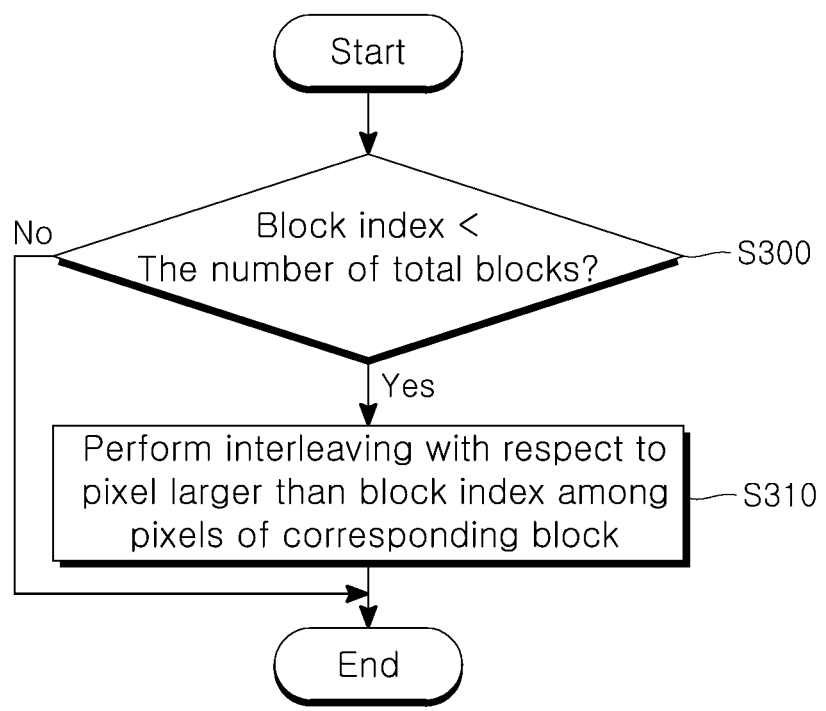
FIG. 3 is a flowchart illustrating a method of performing interleaving according to an embodiment of the present disclosure.

FIG. 3 is a flowchart illustrating a method of performing interleaving according to an embodiment of the present disclosure.

In FIG. 3, in the order of blocks having a smaller block index, an interleaving method with respect to a pixel having a larger pixel index than a block index is disclosed.

Referring to FIG. 3, in operation S300, the interleaving method may determine whether to perform interleaving by comparing the size of the block index and the number of total blocks.

Whether i<n is satisfied starting from i=0 may be determined. Here, i denotes the block index, and n denotes the number of total blocks or the number of total pixels included in a single block. Specifically, when the block index is larger than or equal to the number of total blocks, interleaving may be stopped. When the block index is smaller than the number of total blocks, interleaving may be performed.

In operation S310, the interleaving method performs interleaving with respect to pixels larger than the block index among pixels of the block.

When the block index is smaller than the number of total blocks, interleaving may be performed with respect to a pixel corresponding to a pixel index n−1 starting from a pixel corresponding to a pixel index 0 in a corresponding block. As described above, interleaving may be performed with respect to the pixel having the larger pixel index than the block index based on Equation 1.

FIGS. 4 to 11 are views illustrating interleaving results obtained by performing interleaving based on an interleaving method according to an embodiment of the present disclosure.

A continuous point-spread function (PSF) of a HDS channel model may be represented as the following Equation 3.

$$h(x, y) = \frac{1}{\sigma_b^2} \text{sinc}^2\left(\frac{x}{\sigma_b}, \frac{y}{\sigma_b}\right) \qquad \text{[Equation 3]}$$

Here, when a blur value $\sigma_b$ is increased, ISI may be increased.

A discrete PSF with the misalignment factor may be represented as the following Equation 4.

$$h[p, q] = \int_{q-a/2+m_y}^{q+a/2-m_y} \int_{p-a/2+m_x}^{p+a/2+m_x} h(x, y) dx dy \qquad \text{[Equation 4]}$$

Here, $m_x$ and $m_y$ may respectively denote a misalignment of an x-axis and a y-axis.

In FIGS. 4 to 11, a simulation for 1,000 pages was performed, and each of the 1,000 pages may include 1024×1024 pixels. As channel noise, additive white Gaussian noise (AWGN) may be used. In addition, 1.85 was used as a blur value, and a misalignment of 10% was applied to each of the x-axis and the y-axis. In a signal detection process, 2D-SOVA was used, and a PR 131 was used as a PR target of the channel.

In FIGS. 4 to 11, results obtained by comparing BER performance while increasing a signal to noise ratio (SNR) from 10 dB to 18 dB are shown. In FIGS. 4 to 12, a change in BER of each interleaver in accordance with an increment in a burst error by 20 starting from 20×20 in 1024×1024 pixels included in the page is disclosed.

The simulation was performed with respect to a case (1) in which there is no interleaving with respect to random data, a case (2) in which block interleaving is performed, a case (3) in which cyclic shift interleaving is performed, a case (4) in which helical interleaving is performed, a case (5) in which random interleaving is performed, and a case (6) in which interleaving according to an embodiment of the present disclosure is performed.

In FIGS. 4 to 8, simulation results obtained when a congestion error occurs in 1024×1024 pixels are shown.

Figure 4:
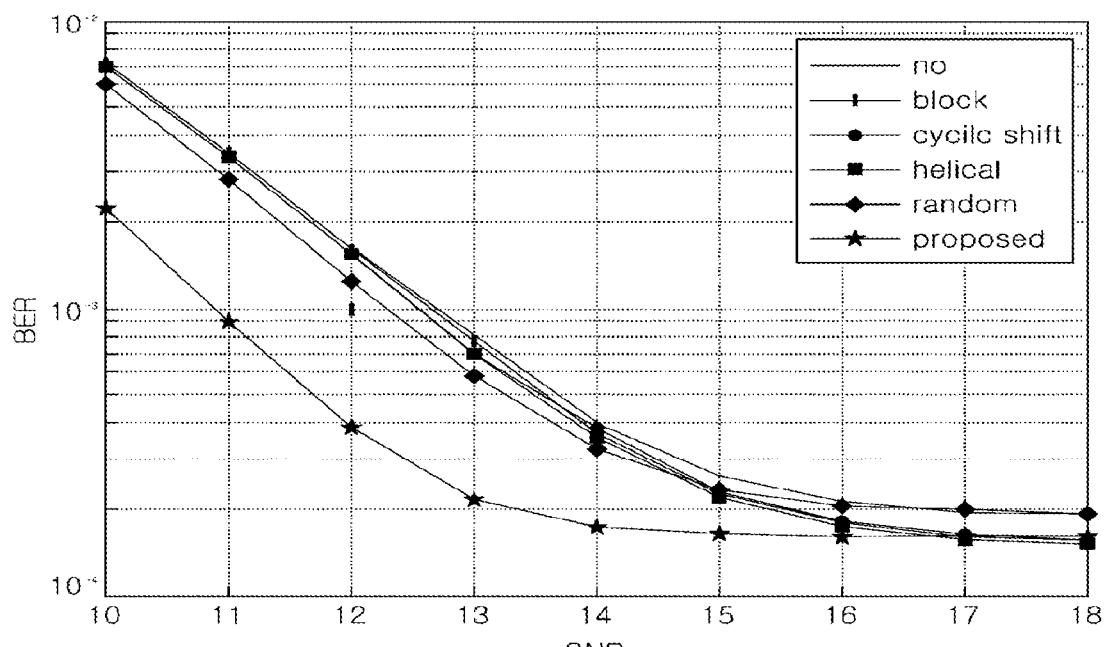
FIGS. 4 to 11 are diagrams illustrating interleaving results when performing interleaving based on an interleaving method according to an embodiment of the present disclosure.

In FIG. 4, the simulation result obtained when a burst error is 20×20 in 1024×1024 pixels is shown.

Referring to FIG. 4, interleaving performance with respect to the burst error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 1.5 to 2.0 dB than that of the existing interleaving method.

Figure 5:
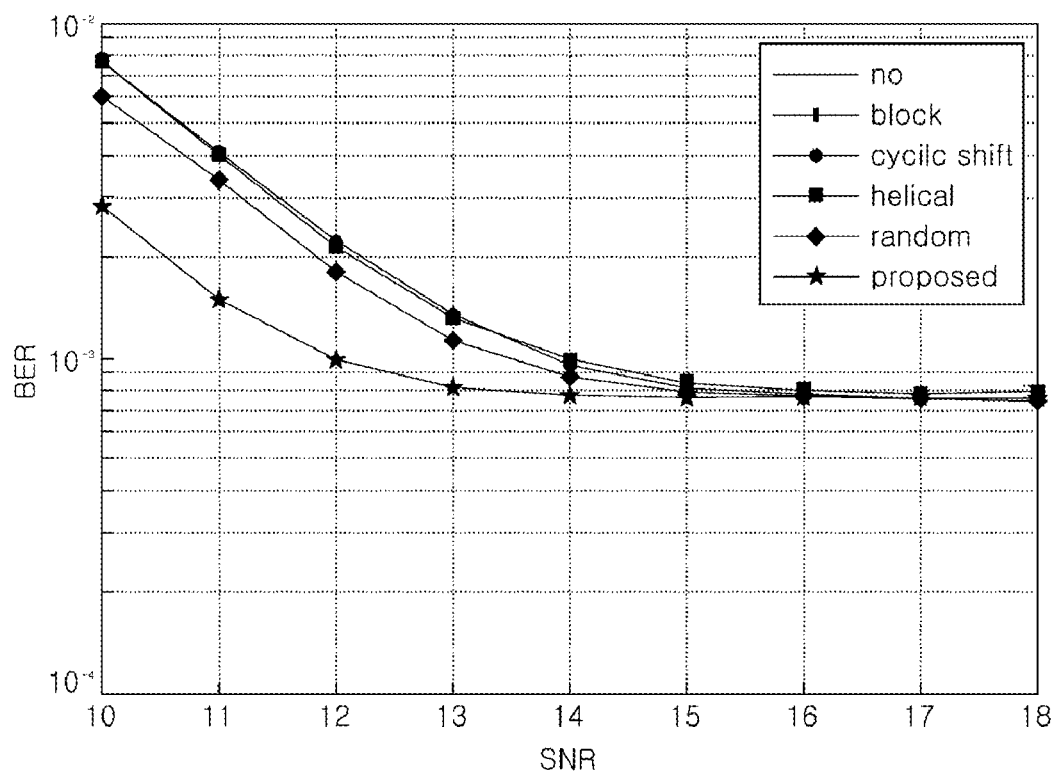

In FIG. 5, the simulation result obtained when the burst error is 40×40 in 1024×1024 pixels is shown.

Referring to FIG. 5, in the same manner as in FIG. 4, interleaving performance with respect to the burst error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 1.5 to 2.0 dB than that of the existing interleaving method.

Figure 6:
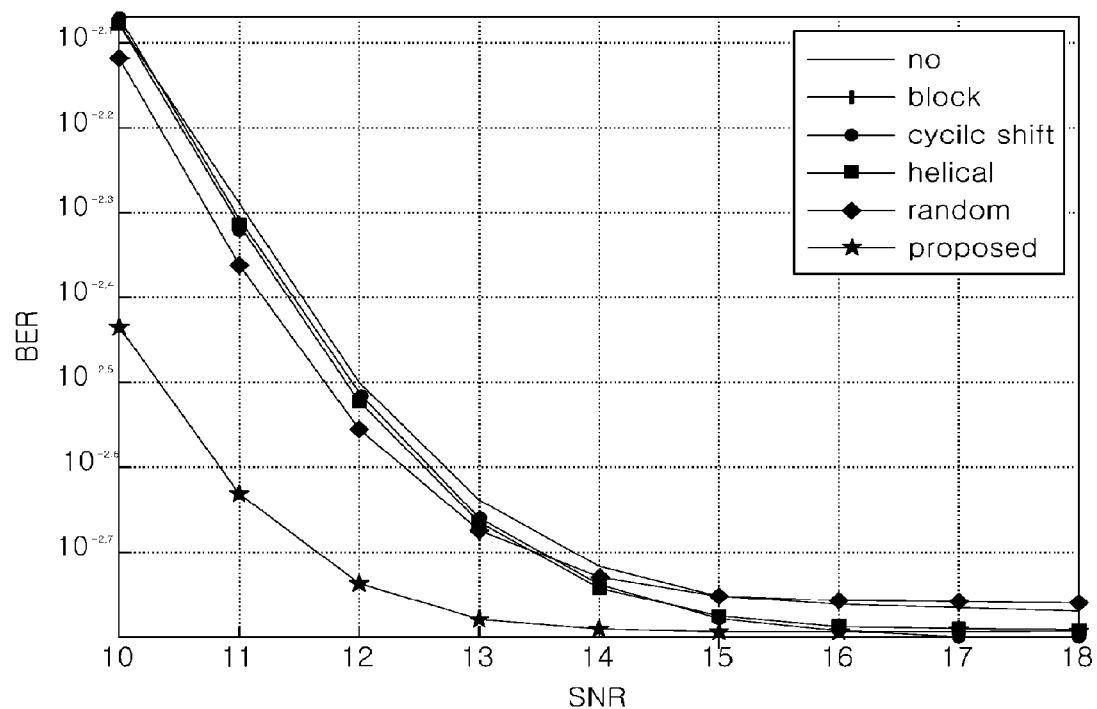

In FIG. 6, the simulation result obtained when the burst error is 60×60 in 1024×1024 pixels is shown.

Referring to FIG. 6, in the same manner as in FIG. 4, interleaving performance with respect to the burst error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 1.5 to 2.0 dB than that of the existing interleaving method.

Figure 7:
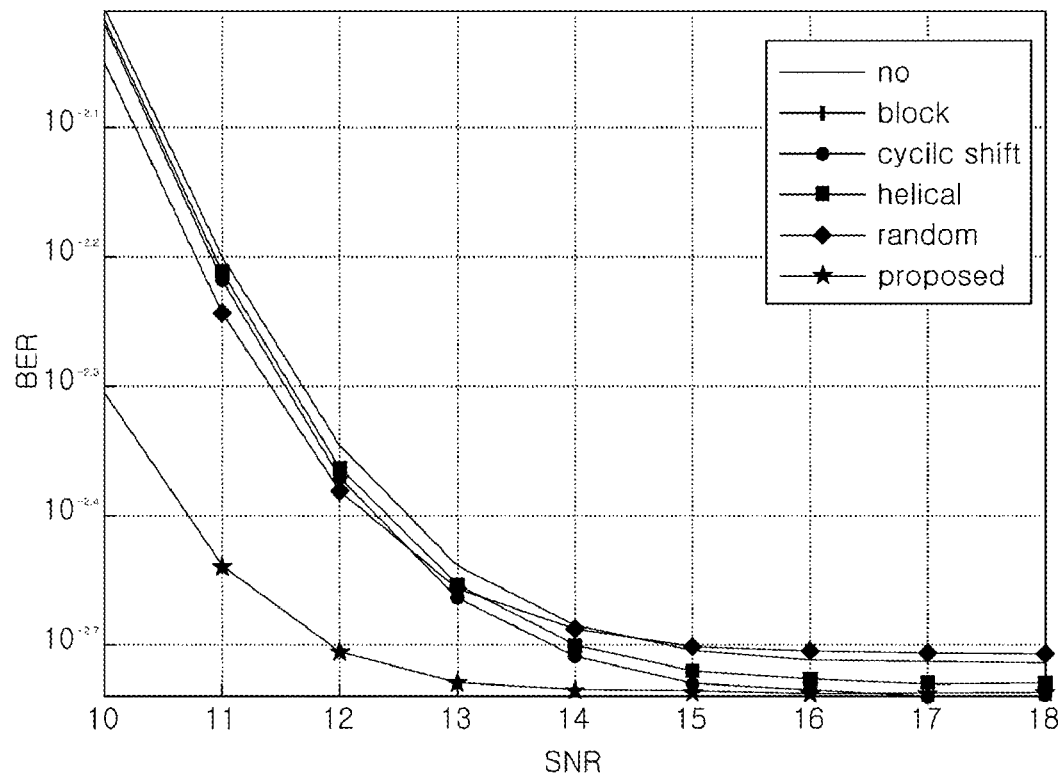

In FIG. 7, the simulation result obtained when the burst error is 80×80 in 1024×1024 pixels is shown.

Referring to FIG. 7, in the same manner as in FIG. 4, interleaving performance with respect to the burst error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 1.5 to 2.0 dB than that of the existing interleaving method.

Figure 8:
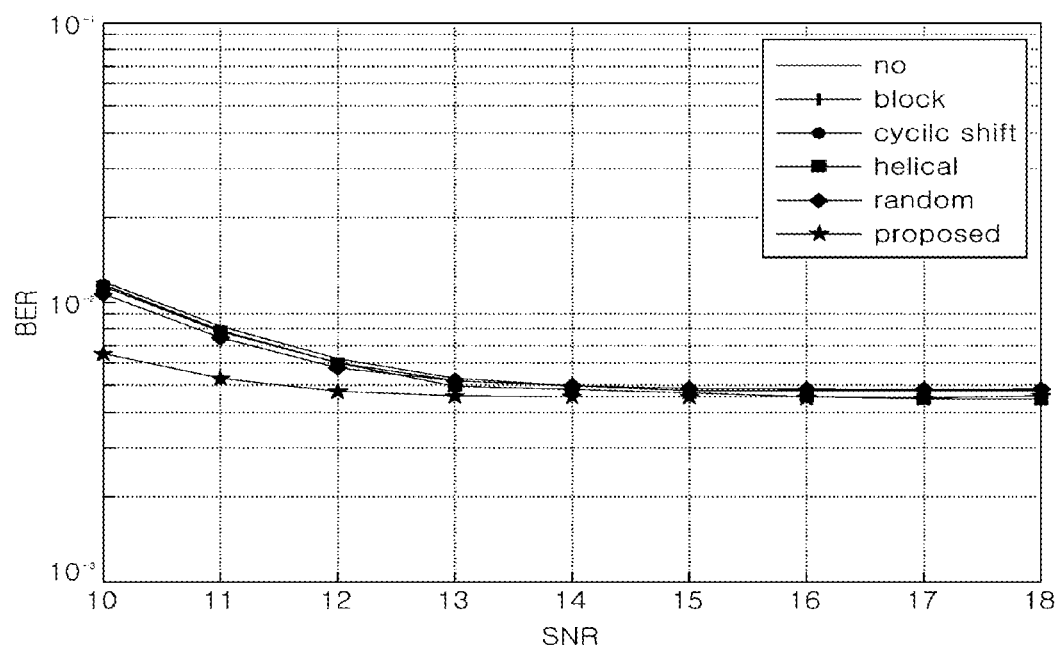

In FIG. 8, the simulation result obtained when the burst error is 100×100 in 1024×1024 pixels is shown.

Referring to FIG. 8, in the same manner as in FIG. 4, interleaving performance with respect to the congestion error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 1.5 to 2.0 dB than that of the existing interleaving method.

Figure 9:
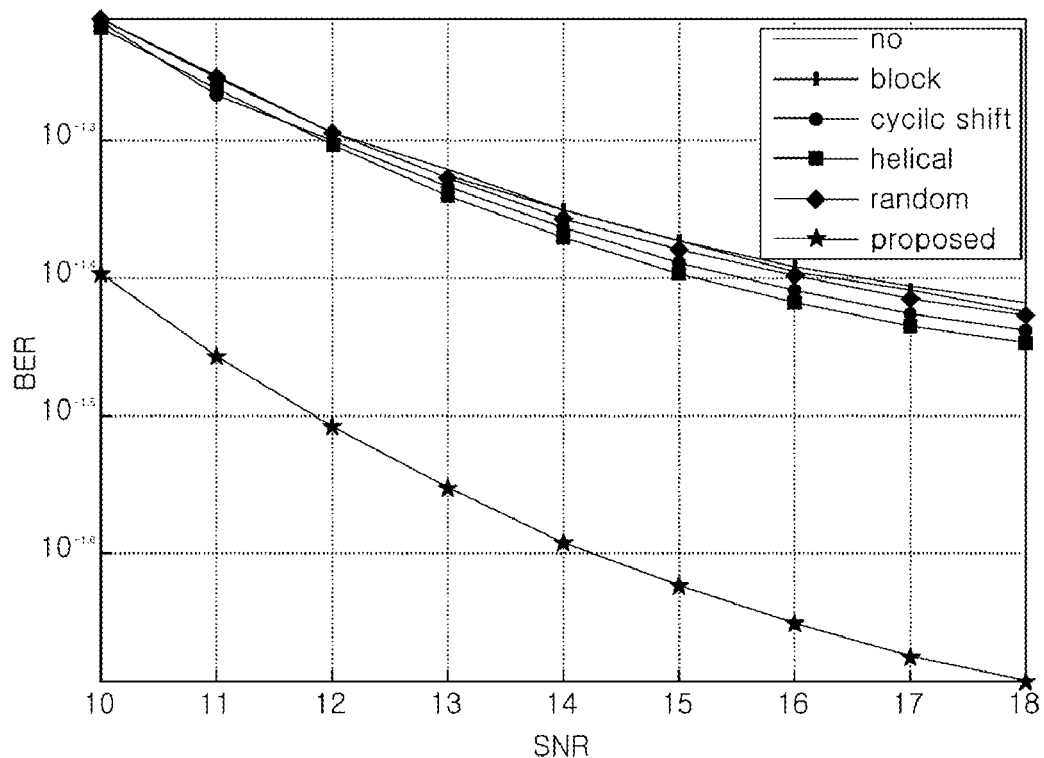
Figure 10:
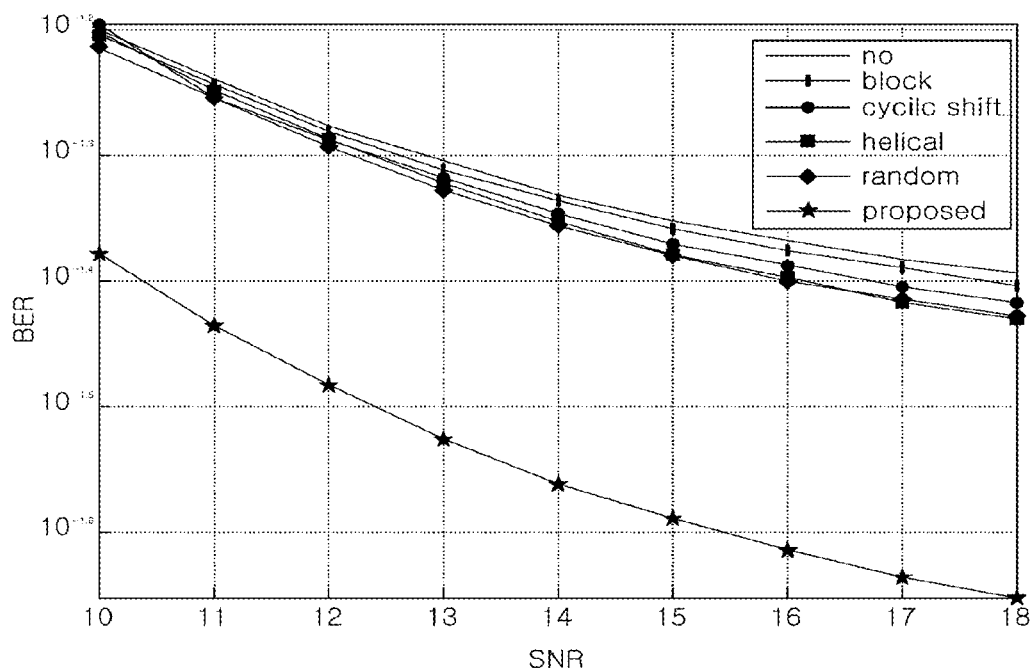
Figure 11:
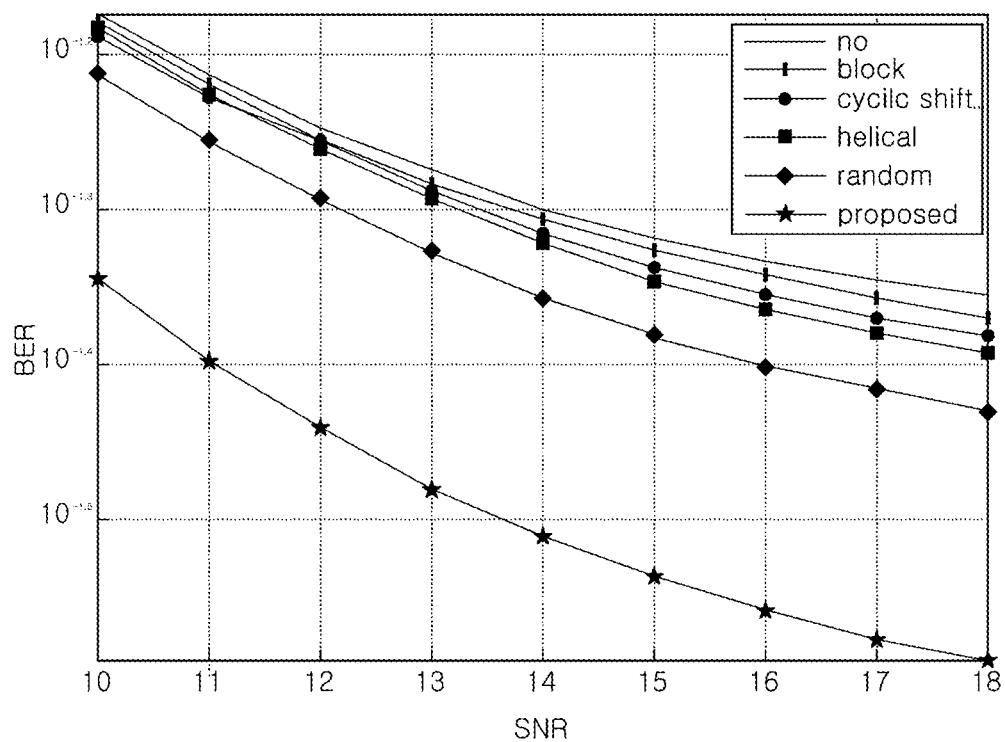

In FIGS. 9 to 11, simulation results obtained when a burst error occurs in 256×256 pixels are shown.

In FIG. 9, the simulation result obtained when the burst error is 10×10 in 256×256 pixels is shown.

Referring to FIG. 9, interleaving performance with respect to the congestion error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 4.5 to 5.0 dB than that of the existing interleaving method.

In FIG. 10, the simulation result obtained when the burst error is 20×20 in 256×256 pixels is shown.

Referring to FIG. 10, interleaving performance with respect to the burst error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 4.5 to 5.0 dB than that of the existing interleaving method.

In FIG. 11, the simulation result obtained when the burst error is 30×30 in 256×256 pixels is shown.

Referring to FIG. 11, interleaving performance with respect to the congestion error may become higher in the order of block interleaving, cyclic shift interleaving, helical interleaving, random interleaving, and interleaving according to an embodiment of the present disclosure. The interleaving method according to an embodiment of the present disclosure shows a more excellent performance by approximately 4.5 to 5.0 dB than that of the existing interleaving method.

Figure 12:
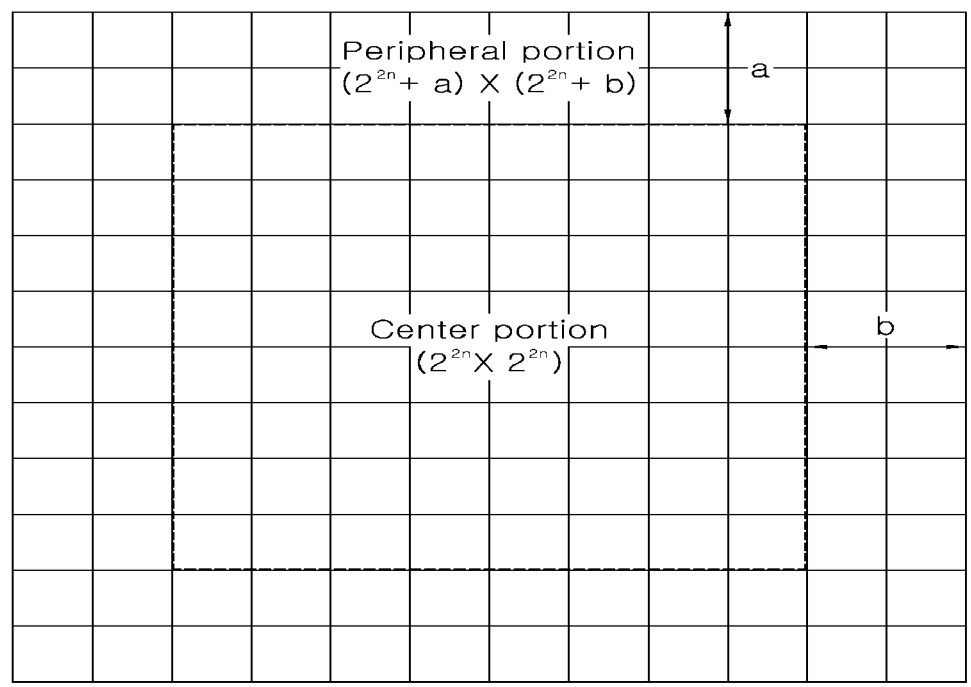
FIG. 12 is a conceptual diagram illustrating an interleaving method according to an embodiment of the present disclosure.

FIG. 12 is a conceptual diagram illustrating an interleaving method according to an embodiment of the present disclosure.

In FIG. 12, an interleaving method which may be used when a size of a page is not $2^n \times 2^n$ is disclosed. When the size of the page is not $2^{2n} \times 2^{2n}$, the size of the page may be $(2^{2n}+a) \times (2^{2n}+b)$.

When the size of the page is $(2^{2n}+a) \times (2^{2n}+b)$, interleaving may be performed by dividing the page into a center portion and a peripheral portion. The center portion may have a size of $2^{2n} \times 2^{2n}$ in a data region positioned at the center of the page. The peripheral portion may be the remaining region excluding the center portion in the page.

In this case, interleaving may be performed with respect to data positioned in the center portion based on the interleaving method disclosed in FIGS. 1 to 3.

Interleaving may be performed with respect to data positioned in the peripheral portion through other various methods. For example, interleaving may be performed with respect to the data positioned in the peripheral portion in the cyclic shift method, or in other various methods.

Alternatively, according to an embodiment of the present disclosure, interleaving may be performed considering the size of the data positioned in the peripheral portion (or the size of each of a and b). When the size of each of a and b is small, a burst error may be dispersed even when interleaving is performed only with respect to the data positioned in the center portion. For example, when a=1 and 2 and b=1 and 2, a burst error may be dispersed while the data positioned in the center portion is interleaved, even though interleaving is not separately performed with respect to the data positioned in the peripheral portion. Conversely, when a>2 and b>2, a burst error may occur in the data positioned in the peripheral portion, and therefore interleaving may be required to be performed with respect to the data positioned in the peripheral portion.

Hereinafter, an interleaving method with respect to data positioned in the peripheral portion will be described in detail.

Figure 13:
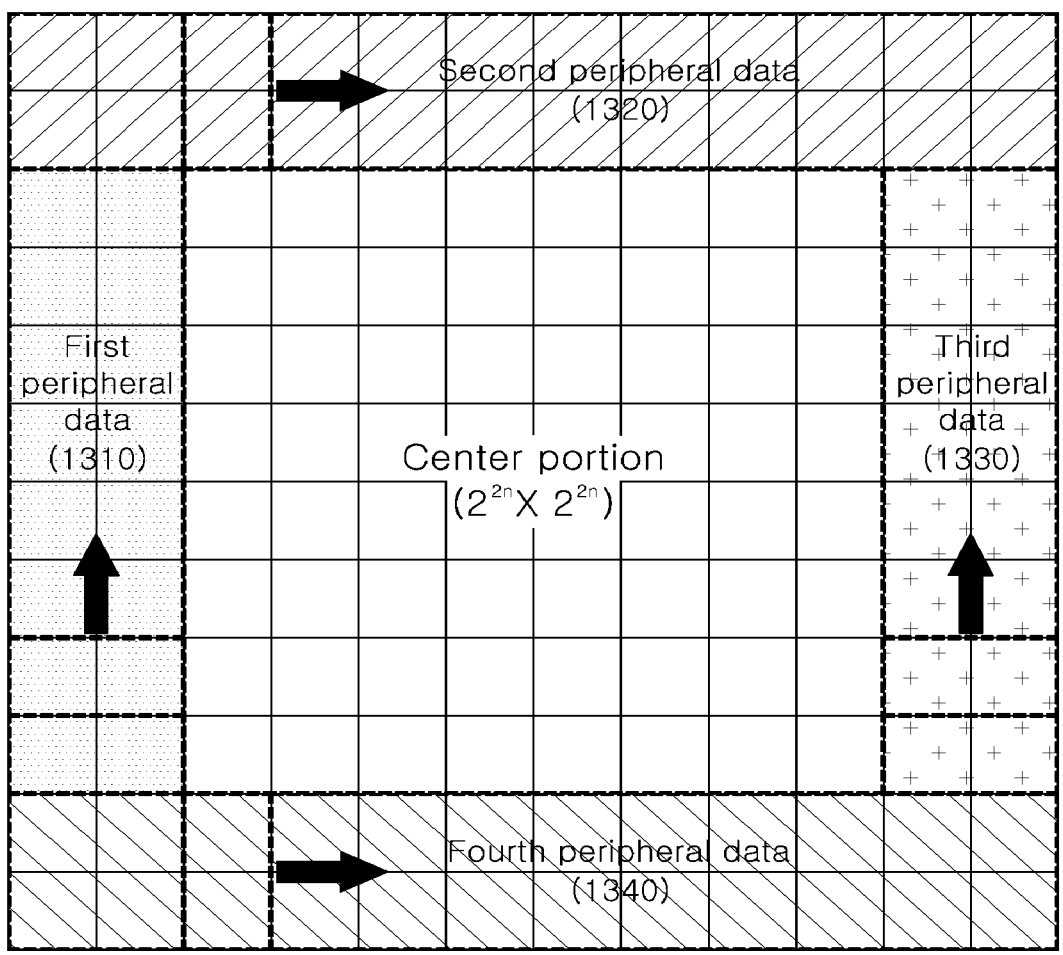
FIG. 13 is a conceptual diagram illustrating an interleaving method according to an embodiment of the present disclosure.

FIG. 13 is a conceptual diagram illustrating an interleaving method according to an embodiment of the present disclosure.

In FIG. 13, a case in which interleaving is performed with respect to data positioned in the peripheral portion in the cyclic shift method is disclosed.

Referring to FIG. 13, when interleaving is performed with respect to data positioned in the peripheral portion in the cyclic shift method, a burst error that exists between data positioned in the peripheral portion and data positioned in the center portion may be improved.

When interleaving is performed in the cyclic shift method, data of each row and each column positioned in the peripheral portion may be shifted into a certain size. For example, the data positioned in the peripheral portion may be classified based on a left side, an upper end, a right side, and a lower end of the corresponding page. Hereinafter, data positioned on the left side, the upper end, the right side, and the lower end may be respectively referred to as first peripheral data 1310, second peripheral data 1320, third peripheral data 1330, and fourth peripheral data 1340.

According to an embodiment of the present disclosure, interleaving based on the same shift size or mutually different shift sizes may be performed with respect to each of the first peripheral data 1310 to the fourth peripheral data 1340. When interleaving based on the same shift size is performed, the shift size may be randomly determined. When the shift size is 2, each of the peripheral data positioned in rows and columns of the peripheral portion in a certain direction may be shifted by 2 rows or columns.

For example, in cases of the first peripheral data 1310 and the third peripheral data 1330, data may be moved by 2 columns in a direction toward the upper end of the page. In addition, in cases of the second peripheral data 1320 and the fourth peripheral data 1340, data may be moved by 2 rows in a direction toward the right side of the page.

When interleaving based on the mutually different shift sizes is performed with respect to each of the peripheral data, shift sizes for shifting each peripheral data may be mutually different. For example, in the first peripheral data 1310, data may be shifted by a columns, and in the third peripheral data 1330, data may be shifted by b columns. In the second peripheral data 1320, data may be shifted by c columns, and in the fourth peripheral data 1340, data may be shifted by d columns.

Figure 14:
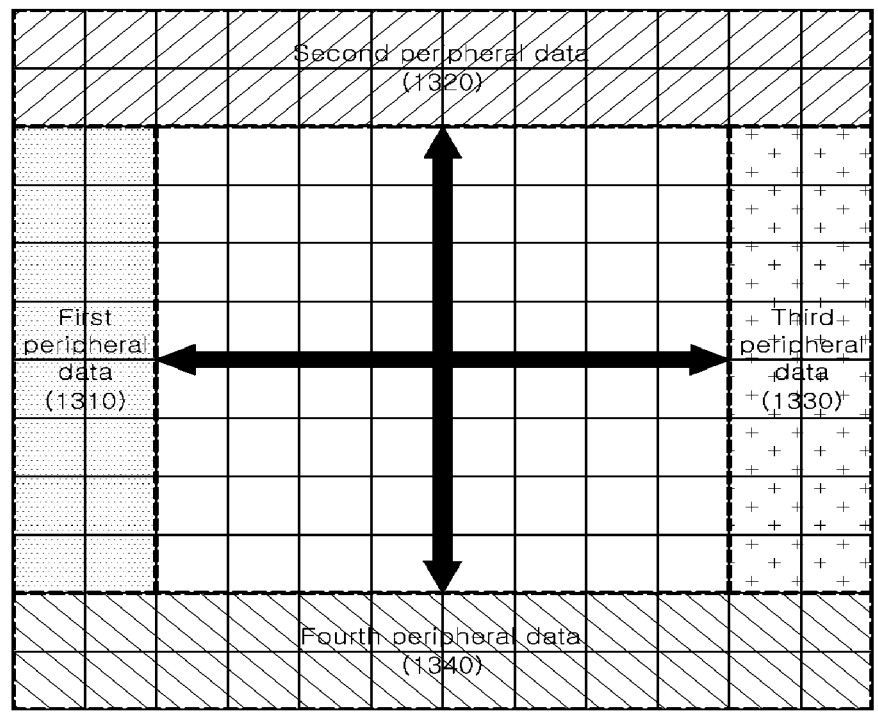
FIG. 14 is a conceptual diagram illustrating an interleaving method according to an embodiment of the present disclosure.
Figure 14:
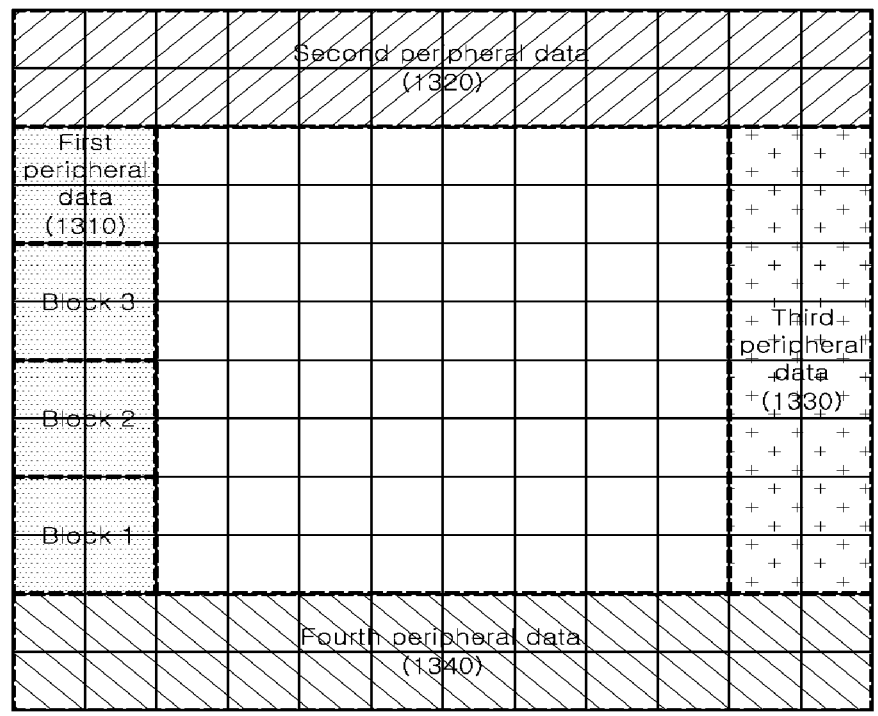

FIG. 14 is a conceptual diagram illustrating an interleaving method according to an embodiment of the present disclosure.

In FIG. 14, a variety of methods in which interleaving is performed with respect to peripheral data in an upper end exchange method are disclosed.

Referring to an upper page of FIG. 14, first peripheral data and third peripheral data among data positioned in the peripheral portion are exchanged with each other, and second peripheral data and fourth peripheral data among the data positioned in the peripheral portion may be exchanged with each other.

Referring to a lower page of FIG. 14, the data positioned in the peripheral portion may be divided into units of blocks, and block interleaving may be performed within the block unit. For example, when a=2 and b=2, each peripheral portion may be divided into a 2×2 block unit. Interleaving in units of blocks may be performed with respect to the 2×2 block. For example, shifting with respect to data of a column unit or a row unit positioned within the block may be performed, or exchange between a data set positioned in rows and a data set positioned in columns may be performed in the same manner as in the above-described block interleaving method.

The interleaving methods disclosed in FIGS. 13 and 14 may be combined with each other to be used. For example, interleaving may be first performed with respect to data positioned in the peripheral portion using the interleaving method of the cyclic shift method disclosed in FIG. 13, and then interleaving method disclosed in FIG. 14 may be performed in units of blocks.

Figure 15:
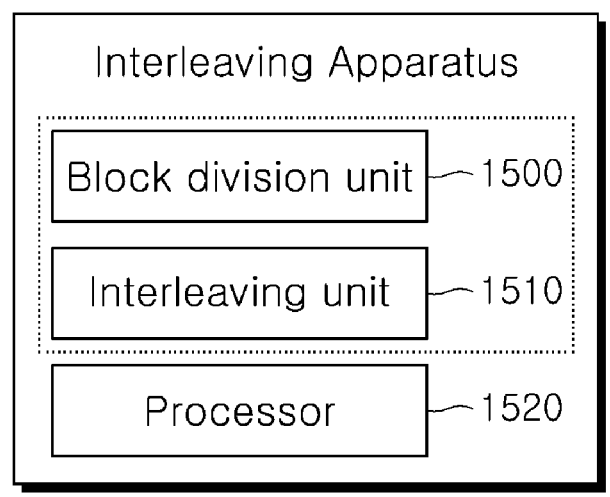
FIG. 15 is a conceptual diagram illustrating an interleaving apparatus according to an embodiment of the present disclosure.

FIG. 15 is a conceptual diagram illustrating an interleaving apparatus according to an embodiment of the present disclosure.

In FIG. 15, an interleaving apparatus for performing the interleaving method disclosed in FIGS. 1 to 14 is disclosed.

Referring to FIG. 15, the interleaving apparatus may include a block division unit 1500, an interleaving unit 1510, and a processor 1520. Each component may perform an operation in the interleaving methods disclosed in FIGS. 1 to 14. For example, each component may perform the following operation.

The block division unit 1500 may perform block division in order to perform interleaving according to an embodiment of the present disclosure. A size of 2D array data to which interleaving according to an embodiment of the present disclosure is applied is $2^{2n} \times 2^{2n}$ (here, n being an integer of 1 or greater), and the 2D array data may be divided into a plurality of data block units each having a size of $2^n \times 2^n$.

The interleaving unit 1510 may perform interleaving with respect to the plurality of divided data blocks. Here, interleaving may be performed based on Equation 1 which is described above.

The processor 1520 may be implemented to control the operations of the block division unit 1500 and the interleaving unit 1510.

In addition, the interleaving apparatus may further include a peripheral interleaving unit. When the size of the 2D array data is $(2^{2n}+a) \times (2^{2n}+b)$ (here, each of n, a, and b is an integer of 1 or greater), the peripheral interleaving unit may be implemented to perform peripheral interleaving with respect to the remaining data excluding data included in a plurality of data block units among the 2D array data in accordance with whether each of a and b is a certain value or greater.

As described above, according to the embodiments of the present disclosure, block interleaving may be performed with respect to the 2D array data. Specifically, the 2D array data may be divided into a plurality of block units, and interleaving may be performed with respect to each of the plurality of block units. Thus, dispersion performance for a burst error may be improved, thereby reducing an error rate with respect to the 2D array data.

The interleaving methods for error dispersion according to various embodiments of the present disclosure may be implemented in the form of program instructions that may be implemented with applications or performed through various computer means, and recorded in a computer-readable recording medium. The computer-readable recording medium may separately include program commands, local data files, local data structures, etc. or include a combination of them. The medium may be specially designed and configured for the present disclosure, or known and available to those of ordinary skill in the field of computer software. Examples of the computer-readable recording medium include magnetic media, such as a hard disk, a floppy disk, and a magnetic tape, optical media, such as a CD-ROM and a DVD, magneto-optical media, such as a floptical disk, and hardware devices, such as a ROM, a RAM, and a flash memory, specially configured to store and perform program commands. Examples of the program commands may include high-level language codes executable by a computer using an interpreter, etc. as well as machine language codes made by compilers. Such a hardware device may be configured to operate in one or more software modules, or vice versa in order to perform the operation of the present disclosure.

It will be apparent to those skilled in the art that various modifications can be made to the above-described exemplary embodiments of the present disclosure without departing from the spirit or scope of the disclosure. Thus, it is intended that the present disclosure covers all such modifications provided they come within the scope of the appended claims and their equivalents.

What is claimed is:

1. A method for interleaving data elements comprised in data frames which are transmitted via a channel for error dispersion, the method comprising:
    dividing a given page of the data frames including two-dimensional (2D) array data into a plurality of data block units; and
    interleaving at least between two of the plurality of data block units,
    wherein a first block unit in the plurality of data block units is set as a reference interleaving block unit, and first data in the first block unit and second data in a second block unit are interleaved, wherein the first block unit and the second block unit are included in the plurality of data block units, and the first block unit is different from the second block unit,
    wherein a size of the 2D array data is $N^2 \times M^2$ (where, each of M and N is an integer of two (2) or greater), and a size of each of the plurality of data block units is $N \times M$,
    wherein the interleaving is performed according to a following equation 1

$$X_i(S_j) \leftrightarrow X_j(S_i), i,j=0,1,2,\ldots,N \times M-1, \quad \text{[Equation 1]}$$

where $X_i^{th}(S_j)$ denotes j-th data in an i-th data block unit, and $X_j^{th}(S_i)$ denotes i-th data in a j-th data block unit.

2. The method of claim 1, wherein a size of the 2D array data is $(2^{2n}+a) \times (2^{2n}+b)$ (where each of n, a, and b is an integer of one (1) or greater), a size of each of the plurality of data block units is $2^n \times 2^n$, and the interleaving is performed according to a following equation 2

$$M_i(S_j) \leftrightarrow M_j(S_i), i,j=0,1,2,\ldots,2^n \times 2^n-1 \quad \text{[Equation 2]}$$

where $M_i(S_j)$ denotes j-th data in an i-th data block unit, and $M_j(S_i)$ denotes i-th data in a j-th data block unit.

3. A method for interleaving data elements comprised in data frames which are transmitted via a channel for error dispersion, the method comprising:
    dividing a given page of the data frames including two-dimensional (2D) array data into a plurality of data block units; and
    interleaving at least between two of the plurality of data block units,
    wherein a first block unit in the plurality of data block units is set as a reference interleaving block unit, and first data in the first block unit and second data in a second block unit are interleaved, wherein the first block unit and the second block unit are included in the plurality of data block units, and the first block unit is different from the second block unit;
    performing peripheral interleaving between remaining data, wherein the remaining data are included in 2D array data but are not included in the plurality of data block units,
    wherein the remaining data have first peripheral data, second peripheral data, third peripheral data, and fourth peripheral data in accordance with a respective position thereof on the 2D array data, wherein the peripheral interleaving comprises:
    a first peripheral interleaving on the first peripheral data based on a first cyclic shift size,
    a second peripheral interleaving on the second peripheral data based on a second cyclic shift size,
    a third peripheral interleaving on the third peripheral data based on a third cyclic shift size, and
    a fourth peripheral interleaving on the fourth peripheral data based on a fourth cyclic shift size.

4. An interleaving apparatus for interleaving data elements comprised in data frame which are transmitted via a channel for error dispersion, the interleaving apparatus comprising:
    a block division unit that divides a given page of the data frame including two-dimensional (2D) array data into a plurality of data block units; and
    an interleaving unit that performs interleaving at least between two of the plurality of data blocks units, which are divided by the block division unit,
    wherein a first block unit in the plurality of data block units is set as a reference interleaving block unit, and first data in the first block unit and second data in a second block unit are interleaved, wherein the first block unit and the second block unit are included in the plurality of data block units, and the first block unit is different from the second block unit, wherein a size of the 2D array data is $(2^{2n}+a)\times(2^{2n}+b)$ where each of n, a, and b is an integer of one (1) or greater), a size of each of the plurality of data block units is $2^n\times2^n$, and the interleaving is performed according to a following equation 2, $$M_i(S_j) \leftrightarrow M_j(S_i), i,j=0,1,2,\ldots,2^n\times2^n-1 \qquad \text{[Equation 2]}$$

where $M_i(S_j)$ denotes j-th data included in an i-th data block unit, and $M_j(S_i)$ denotes i-th data included in a j-th data block unit, performing peripheral interleaving between remaining data when each of a and b is greater than a predetermined value, wherein the remaining data are included in 2D array data but are not included in the plurality of data block units, wherein the remaining data have first peripheral data, second peripheral data, third peripheral data, and fourth peripheral data in accordance with a respective position thereof on the 2D array data, wherein the peripheral interleaving comprises:

a first peripheral interleaving on the first peripheral data based on a first cyclic shift size, a second peripheral interleaving on the second peripheral data based on a second cyclic shift size, a third peripheral interleaving on the third peripheral data based on a third cyclic shift size, and a fourth peripheral interleaving on the fourth peripheral data based on a fourth cyclic shift size.

5. The interleaving apparatus of claim 4, wherein a size of the 2D array data is $N^2\times M^2$ (where, each of M and N is an integer of two (2) or greater), and a size of each of the plurality of data block units is N×M.

6. The interleaving apparatus of claim 5, wherein the interleaving is performed according to a following equation 1, $$X_i(S_j) \leftrightarrow X_j(S_i), i,j=0,1,2,\ldots,N\times M-1, \qquad \text{[Equation 1]}$$

where $X_i^{th}(S_j)$ denotes j-th data included in an i-th data block unit, and $X_j^{th}(S_i)$ denotes i-th data included in a j-th data block unit.

* * * * *